United States Patent [19]

Fournel

[11] Patent Number: 5,440,255
[45] Date of Patent: Aug. 8, 1995

[54] CIRCUIT FOR THE DETECTION OF A HIGH THRESHOLD OF A SUPPLY VOLTAGE

[75] Inventor: Richard Fournel, Trets, France

[73] Assignee: SGS-Thomson Microelectronics, S.A., Gentilly, France

[21] Appl. No.: 237,728

[22] Filed: May 4, 1994

Related U.S. Application Data

[63] Continuation of Ser. No. 857,732, Mar. 26, 1992, abandoned.

[30] Foreign Application Priority Data

Mar. 28, 1991 [FR] France .................. 91 03766

[51] Int. Cl.⁶ .................. H03K 5/153; H03L 7/00
[52] U.S. Cl. ........................ 327/81; 327/77; 327/143
[58] Field of Search ............... 307/350, 362, 363, 318, 307/272.3, 296.4; 327/77, 80, 81, 143, 584, 546

[56] References Cited

U.S. PATENT DOCUMENTS

| | | | |
|---|---|---|---|
| 3,806,741 | 4/1974 | Smith | 307/350 |
| 4,359,652 | 11/1982 | Jarret et al. | 307/350 |
| 4,367,422 | 1/1983 | Leslie | 307/363 |
| 4,507,571 | 3/1985 | Callan | 307/350 |
| 4,536,667 | 8/1985 | Masuda | 307/296.4 |
| 4,599,672 | 7/1986 | Planer et al. | 307/296.4 |
| 4,658,156 | 4/1987 | Hashimoto . | |
| 4,674,035 | 6/1987 | Engel | 307/350 |
| 4,746,818 | 5/1988 | Hafner | 307/363 |
| 5,097,146 | 3/1992 | Kowalski et al. | 307/363 |

FOREIGN PATENT DOCUMENTS 2613491  4/1987  France .

OTHER PUBLICATIONS

Desai, et al., "Ueber-und Unterspannungs-Uberwachungsschaltungen", Electronic, No. 22, Nov. 1981, pp. 57–62.
Akiyama, "Detection Circuit of Voltage Drop", Patent Abstracts of Japan, vol. 8, Jun. 2, 1984, No. 125, p. 279.
Jachowski, "Monitor Supplies Down to 0.6V", Electronic Design, vol. 37, No. 20, Sep. 1989, pp. 94–95.

Primary Examiner—Timothy P. Callahan
Assistant Examiner—Toan Tran
Attorney, Agent, or Firm—Robert Groover; Betty Formby

[57] ABSTRACT

A circuit for the detection of a high threshold supply voltage comprising a voltage divider and an inverter. The voltage divider is formed by a reverse-biased voltage breakdown device, such as a Zener diode, and a resistive element, such as a forward-biased transistor or a resistor. The use of the reverse-biased voltage breakdown device in the divider makes the detection threshold voltage (Vo) of the circuit stable and precise even with variations in threshold voltages due to temperature and manufacturing process variations.

9 Claims, 2 Drawing Sheets

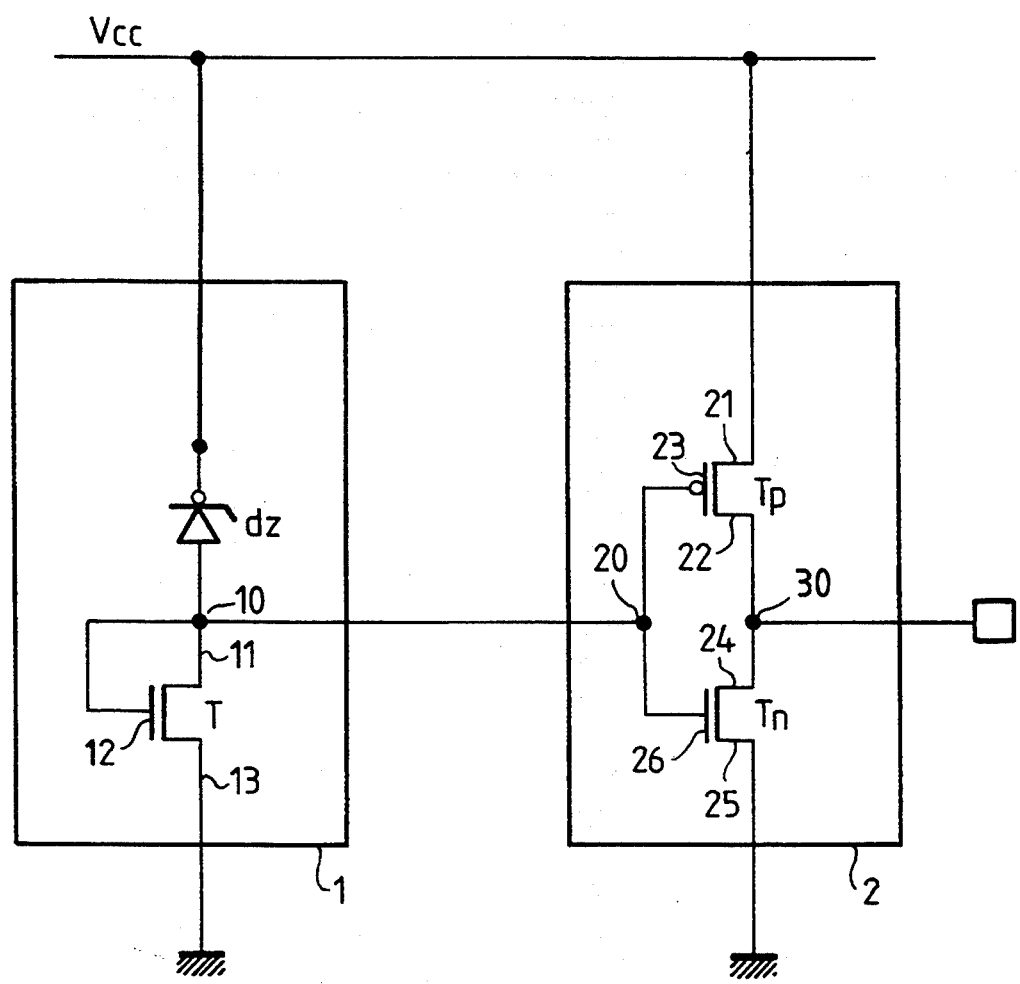
FIG_1

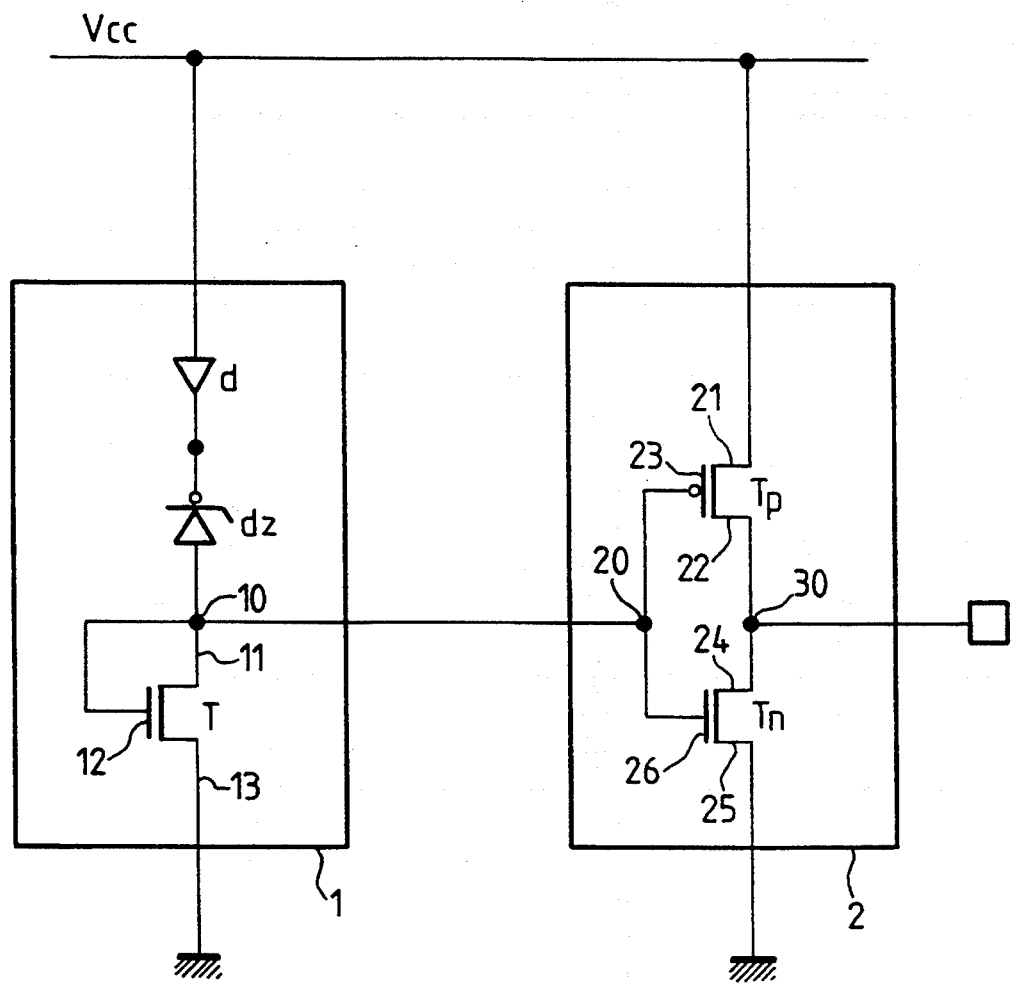
FIG_2

CIRCUIT FOR THE DETECTION OF A HIGH THRESHOLD OF A SUPPLY VOLTAGE

This is a continuation of application Ser. No. 07/857,732, filed Mar. 26, 1992 now abandoned.

TECHNICAL FIELD OF THE INVENTION

The present invention is a high threshold supply voltage detector for an integrated circuit. It can be applied, in particular, to protect integrated circuits designed for banking applications.

BACKGROUND OF THE INVENTION

Integrated circuits operate reliably if the control signals supplied to the integrated circuit always assume values within a set of limited values. In particular, the supply voltage Vcc should always have a value below a high threshold voltage. If this threshold voltage is exceeded, an uncontrolled operation of the integrated circuit may occur. For example, abnormal access to protected data of an integrated circuit may occur with an abnormally high value of supply voltage Vcc (beyond the upper limit of the set of limit values). As a result, a fraudulent individual could access a protected system and modify, for example, the information contained in a bank card.

Undesirable operations facilitating fraud are prevented by the use of a high threshold supply voltage detector integrated into the circuit. Such a detection circuit protects the system by enabling, for example, the locking of access to the system, or its memory, as soon as the detector detects a higher supply voltage than the detection threshold voltage value.

It is important for the detection threshold voltage value to remain constant. For example, integrated circuits can work in a very wide range of temperatures for example, a temperature range of $-40°$ C. to $+85°$ C.), so the detection threshold voltage value must remain substantially constant over this temperature range. Additionally, integrated circuits may vary substantially with different methods used to manufacture the circuit, so the value of the threshold voltage must remain substantially constant with each method of manufacture of the integrated circuit.

In known detectors, the detection threshold voltage varies greatly with the temperature of the circuit's environment and with the manufacturing methods used to fabricate the detector. In certain cases, it is possible to compensate for certain variations, as in the case of the detector described in the French patent application No. FR 89 16650 filed on behalf of the present Applicant. In this example, the detector is formed in a standard way by coupling a resistive voltage divider having an upper and lower arm to a CMOS inverter. The upper arm of the voltage divider, between Vcc and the voltage divider output node, comprises a P-channel transistor in series with a first N-channel transistor. The lower arm, between the output node and the ground, comprises a second N-channel transistor.

The N-channel and P-channel transistors in the upper arm are mounted as forward-biased diodes. In this structure, the first N-channel transistor has the function of compensating for the variations with the temperature of the N-channel transistor of the lower arm of the divider. The two N-channel transistors are technologically identical (with the same dimension and the same threshold voltage).

The known compensation techniques are not sufficient to keep the detection threshold voltage stable from one detector to the next due to technological variations in the manufacturing methods and variations in temperature.

In manufacturing such a detector, an N-channel transistor has a typical threshold voltage at $0°$ C. of 0.833 volts. In practice, the threshold voltages range from 0.697 ($Vtn_{min}$) to 0.978 volt ($Vtn_{max}$), giving an absolute difference of the order of 200 to 300 millivolts. A P-channel transistor has a typical threshold voltage at $0°$ C. of $-1.103$ volts. In practice, threshold voltages range from $-1.206$ ($Vtp_{min}$) to $-1.016$ volts ($Vtp_{max}$), giving an absolute difference of the order of 200 millivolts.

With technological and temperature variations in the threshold voltages, the following values are thus obtained, in one example, for the detection threshold voltage value, Vo.

Vo equals 5.18 volts at $85°$ C. for values of Vtn and Vtp of 0.697 and $-1.206$, respectively.

Vo=8.85 volts at $-40°$ C. and for values of Vtn and Vtp of 0.978 and $-1.016$, respectively.

These results demonstrate a difference of Vo on the order of 3.5 volts for the temperature range considered ($85°$ C. to $-40°$ C.). The threshold voltage values Vtn and Vtp are all given at $0°$ C.

In protected circuits, it is necessary to precisely keep signals within a set of limited values. The detectors currently known in the art cannot reliably or precisely keep voltage signals within a limited set of values with such a wide threshold voltage variation.

SUMMARY OF THE INVENTION

A selected embodiment of the present invention is a circuit for detecting a high voltage limit for a monitored supply voltage. The circuit includes a first power terminal which provides the monitored supply voltage with respect to a second power terminal. A zener diode has a first terminal which is connected to the first power terminal and a second terminal which is connected to an output node. A resistive element, such as an MOS transistor or resistor, has a first terminal which is connected to the output node and has a second terminal which is connected to the second power terminal. The voltage state at the output node changes when the monitored supply voltage exceeds the high voltage limit.

In further aspects of the present invention, the zener diode has a threshold voltage which is higher than a nominal voltage of the monitored supply voltage and is lower than the high voltage limit.

In a still further aspect of the present invention, a CMOS inverter is provide which has an input voltage trip point which is approximately the high voltage limit less the threshold voltage of the zener diode.

BRIEF DESCRIPTION OF THE DRAWING

For a more complete understanding of the present invention and the advantages thereof, reference is now made to the following description taken in conjunction with the accompanying drawings in which:

FIG. 1 shows a first detection circuit according to the invention, and

FIG. 2 shows a second detection circuit according to the invention.

DETAILED DESCRIPTION OF THE INVENTION

A detector according to the invention disclosed in FIG. 1 comprises a voltage divider 1 coupled to an inverter 2. The voltage divider 1 includes a Zener diode dz coupled in a reverse-biased configuration between Vcc and an output node 10 of the divider. The cathode of the Zener diode dz is connected to supply voltage Vcc and the anode is coupled to the common output node 10 of the voltage divider 1. A transistor T is coupled between the output node 10 and ground thereby comprising a lower arm of the voltage divider. The transistor T is an N-channel type of transistor, with a drain 11, a gate 12 and a source 13. The drain 11 is connected to the output node 10 and to the gate 12, while the source 13 is connected to ground. Mounted in this way, the transistor T works in resistive mode. The transistor T could be replaced by a resistor.

In the example, the inverter 2 is a CMOS inverter which includes a P-channel and N-channel transistor. The P-channel type transistor Tp has its source 21 connected to Vcc, its drain 22 connected to an output node 30 of the inverter and its gate 23 connected to an input point 20 of the inverter. The N-channel type transistor Tn has its drain 24 connected to the output node 30 of the inverter, its source 25 connected to ground and its gate 26 connected to the input point 20 of the inverter 2.

The Zener diode is chosen with a value of the threshold voltage Vz slightly higher than a nominal value of the voltage to be monitored Vcc. The inverter 2 is calibrated (i.e. the geometry and doping of the transistors are calculated) to flip over when a value of the monitored voltage Vcc is higher than the value of the diode threshold. The value of the diode output signal from the voltage divider is obtained when a predetermined value Vo of the voltage to be monitored is reached and/or exceeded. This predetermined voltage value must be higher than the value of the diode threshold voltage. Thus, detection threshold value is Vo and the Zener diode threshold voltage value is Vz. If Vcc≧Vo, the output node of the voltage divider sends a signal to the inverter which equals at least Vo−Vz in order to make the inverter flip over to indicate an overthreshold voltage condition.

As long as the voltage Vcc is below the diode threshold voltage Vz, no current flows in the divider and the output node 10 of the divider is at zero volts. The CMOS inverter receives a low voltage level from node 10, and delivers the inverse, a high voltage level, at its output node 30.

When the voltage Vcc exceeds the threshold Vz of the diode, the diode becomes conductive and immediately draws substantial current. The voltage at the diode terminals will then be established at the value of the Zener threshold Vz. The N-channel transistor which works in the resistive mode (being mounted as a forward-biased-diode) will then absorb the difference (Vcc−Vz) at its terminals. Thus, the output node 10 is taken to the potential Vcc−Vz.

If Vo is the detection threshold voltage, (i.e. the maximum value of the voltage Vcc defined by the set of limit values), then the inverter 2 is such that it flips over when its input node 20 is taken to the potential Vo−Vz. That is, the inverter 2 will flip over only when the voltage divider provides an output signal to the inverter equal to the detection threshold value minus the Zener diode threshold voltage value. Upon the occurrence of a flip-over, the output 30 of the inverter is then taken to the zero potential.

A device such as this possesses a very stable threshold voltage in relation to differences in temperature and in relation to its method of manufacture. Indeed, the Zener diode threshold voltage, Vz, varies far less with its method of manufacture and with the temperature than that of the transistors in its environment.

In one example, the threshold voltage Vz has a typical value, at 25° C., of 5.31 volts which varies with the manufacturing process, between 5.26 and 5.42 volts. The temperature variation of the threshold voltage Vz for a given value is of the order of 80 mv between −40° C. and 85° C.

It is also necessary to account for the manufacturing and temperature variations of the transistors in the CMOS inverter because they are formed by MOS technology and are subject to technological and temperature variations. For example, the value of the voltage Vcc at which the inverter flips over may be 6 volts at 85° C., 5.85 volts at 25° C. and 5.25 volts at −40° C.

On the whole, in one example, for a high threshold Vo of 6 volts, the following results are obtained with the device of the invention:

$Vo_{real}$=5.60 volts at 85° C., for (Vz, Vtn, Vtp)=(5.26, 0.697, −1.206) (volts), respectively.

$Vo_{real}$=6.20 volts at −40° C. for (Vz, Vtn, Vtp)=(5.42, 0.998, −1.016) (volts), respectively.

These results demonstrate an absolute voltage difference, between the two real voltage detection thresholds, of 0.60 volts. For a high threshold Vo of 6.5 volts, the same order of magnitude is obtained.

Thus, from one detector to another (with different Vtn, Vtp, Vz values) and for different temperatures, it is certain that the upper limit of the set of limit values (6 volts) can be complied with, in the example, to within at least ±0.4 volts. Thus, a detector such as this may be integrated into and used reliably in protected circuits.

In a second embodiment, a forward-biased diode d in FIG. 2 (with the cathode connected to the cathode of the Zener diode and the anode connected to Vcc) is positioned in series with the reverse-biased Zener diode. This additional forward-biased diode makes it possible to compensate somewhat for the temperature variations in the Zener threshold voltage, and to further reduce other voltage threshold variations in the device. This circuit performs in essentially the same fashion to the circuit discussed above in FIG. 1.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

What is claimed is:

1. A circuit for detecting a high voltage limit for a monitored supply voltage, comprising, a first power terminal which carries said monitored supply voltage, a second power terminal, a zener diode having a first terminal thereof connected to said first power terminal and a second terminal thereof connected to an output node, and a resistive element having a first terminal thereof connected to said output node and a second terminal thereof connected to said second power terminal, wherein the voltage at said output node changes when said monitored supply voltage exceeds said high voltage limit; and a logic gate which is powered directly from said first and second power terminals and connected to said output node and configured to be switched when the voltage at said output node changes as said monitored supply voltage exceeds said high voltage limit; wherein said zener diode has a threshold voltage which is higher than a nominal voltage of said monitored supply voltage but less than the voltage of said high voltage limit.

2. A circuit for detecting a high voltage limit for a monitored supply voltage as recited in claim 1 wherein said resistive element is an MOS transistor connected as a forward biased diode.

3. A circuit for detecting a high voltage limit for a monitored supply voltage, comprising:
 a first power terminal which carries said monitored supply voltage;
 a second power terminal;
 a zener diode having a first terminal thereof connected to said first power terminal and a second terminal thereof connected to an output node;
 a resistive element having a first terminal thereof connected to said output node and a second terminal thereof connected to said second power terminal, wherein the voltage at said output node changes when said monitored supply voltage exceeds said high voltage limit;
 a logic gate which is powered directly from said first and second power terminals and connected to said output node and configured to be switched when the voltage at said output node changes as said monitored supply voltage exceeds said high voltage limit; wherein said zener diode has a threshold voltage which is higher than a nominal voltage of said monitored supply voltage but less than the voltage of said high voltage limit; and
 a diode connected between said zener diode and said first power terminal.

4. A circuit for detecting a high voltage limit for a monitored supply voltage, comprising:
 a first power terminal which carries said monitored supply voltage;
 a second power terminal;
 a zener diode having a first terminal thereof connected to said first power terminal and a second terminal thereof connected to an output node;
 a resistive element having a first terminal thereof connected to said output node and a second terminal thereof connected to said second power terminal, wherein the voltage at said output node changes when said monitored supply voltage exceeds said high voltage limit;
 a logic gate which is powered directly from said first and second power terminals and connected to said output node and configured to be switched when the voltage at said output node changes as said monitored supply voltage exceeds said high voltage limit; wherein said zener diode has a threshold voltage which is higher than a nominal voltage of said monitored supply voltage but less than the voltage of said high voltage limit;
 wherein said logic gate includes a CMOS inverter, said CMOS inverter connected between said first and said second power terminals, said inverter having a input trip voltage which is approximately said high voltage limit minus the threshold voltage of said zener diode, and having an inverter input thereof connected to said output node, which is the junction of said zener diode and said resistive element, and said inverter having an inverter output for producing a signal to indicate that said monitored supply voltage has exceeded said high voltage limit.

5. A circuit for detecting a high voltage limit for a monitored supply voltage, comprising,
 a first power terminal which carries said monitored supply voltage,
 a second power terminal,
 a zener diode having a cathode terminal thereof connected to said first power terminal and an anode terminal thereof connected to an output node, said zener diode having a threshold voltage which is greater than a nominal voltage of said monitored supply and which is less than said high voltage limit, and
 an MOS transistor having drain and source terminals thereof connected between said output node and said second power terminal and having a gate terminal thereof connected to said output node, wherein the voltage state at said output node changes when said monitored supply voltage exceeds said high voltage limit; and
 a logic gate which is powered directly from said first and second power terminals and connected to said output node and configured to be switched when the voltage at said output node changes as said monitored supply voltage exceeds said high voltage limit.

6. A circuit for detecting a high voltage limit for a monitored supply voltage, comprising:
 a first power terminal which carries said monitored supply voltage,
 a second power terminal,
 a zener diode having a cathode terminal thereof connected to said first power terminal and an anode terminal thereof connected to an output node, said zener diode having a threshold voltage which is greater than a nominal voltage of said monitored supply and which is less than said high voltage limit, and
 an MOS transistor having drain and source terminals thereof connected between said output node and said second power terminal and having a gate terminal thereof connected to said output node, wherein the voltage state at said output node changes when said monitored supply voltage exceeds said high voltage limit; and
 a logic gate which is powered directly from said first and second power terminals and connected to said output node and configured to be switched when the voltage at said output node changes as said monitored supply voltage exceeds said high voltage limit; and
 a diode having the cathode thereof connected to said zener diode and the anode thereof connected to said first power terminal.

7. A circuit for detecting a high voltage limit for a monitored supply voltage, comprising:
 a first power terminal which carries said monitored supply voltage,
 a second power terminal,
 a zener diode having a cathode terminal thereof connected to said first power terminal and an anode terminal thereof connected to an output node, said zener diode having a threshold voltage which is greater than a nominal voltage of said monitored supply and which is less than said high voltage limit, and an MOS transistor having drain and source terminals thereof connected between said output node and said second power terminal and having a gate terminal thereof connected to said output node, wherein the voltage state at said output node changes when said monitored supply voltage exceeds said high voltage limit; and a logic gate which is powered directly from said first and second power terminals and connected to said output node and configured to be switched when the voltage at said output node changes as said monitored supply voltage exceeds said high voltage limit;

wherein said logic gate includes a CMOS inverter, said CMOS inverter being connected between said first and said second power terminals and having an inverter input thereof connected to said output node, which is the junction of said zener diode and said resistive element, and said inverter having an inverter output for producing a signal to indicate that said monitored supply voltage has exceeded said high voltage limit.

8. A method for detecting when a monitored supply voltage (Vcc) has exceeded a high voltage limit (Vo), comprising the steps of:

providing said monitored supply voltage (Vcc) between first and second power terminals, applying said monitored supply voltage (Vcc) to a series combination of a zener diode and a resistive element connected between said first and said second power terminals, said zener diode and said resistive element connected together at an output node, said zener diode having a threshold voltage of Vz, reverse biasing said zener diode in excess of said threshold voltage thereof when said monitored supply voltage (Vcc) equals or exceeds said high voltage limit (Vo), thereby producing a flow of current through said resistive element to produce a output signal having a voltage of Vo-Vz at said output node, and supplying said output signal to the input of a CMOS inverter which is powered directly from said monitored supply voltage, and which has a input trip voltage of approximately Vo-Vz, wherein said CMOS inverter produces a first voltage state at an output terminal thereof when said output signal is less than Vo-Vz and produces a second voltage state at said output terminal thereof when said output signal is equal to or greater than Vo-Vz.

9. A method for detecting when a monitored supply voltage (Vcc) has exceeded a high voltage limit (Vo) as recited in claim 8 including the step of providing a one diode voltage drop between said first power terminal and said zener diode when said zener diode has been reverse biased.

* * * * *